(12) United States Patent
Zhang

(10) Patent No.: US 10,715,927 B2
(45) Date of Patent: Jul. 14, 2020

(54) MEMS MICROPHONE

(71) Applicant: AAC Acoustic Technologies (Shenzhen) Co., Ltd., Shenzhen (CN)

(72) Inventor: Jinyu Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/233,406

(22) Filed: Dec. 27, 2018

(65) Prior Publication Data

US 2019/0238997 A1    Aug. 1, 2019

(30) Foreign Application Priority Data

Jan. 31, 2018    (CN) .................... 2018 2 0167597 U

(51) Int. Cl.
*H04R 19/04* (2006.01)
*B81B 3/00* (2006.01)
*H04R 19/00* (2006.01)

(52) U.S. Cl.
CPC .......... *H04R 19/04* (2013.01); *B81B 3/0072* (2013.01); *H04R 19/005* (2013.01); *B81B 2201/0257* (2013.01); *B81B 2203/0127* (2013.01); *H04R 2201/003* (2013.01); *H04R 2499/11* (2013.01)

(58) Field of Classification Search
CPC .................. H04R 19/04; H04R 19/005; H04R 2201/003; H04R 2499/11; B81B 3/0072; B81B 2201/0257; B81B 2203/0127
See application file for complete search history.

(56) References Cited

U.S. PATENT DOCUMENTS

| | | | |
|---|---|---|---|
| 2014/0050338 A1* | 2/2014 | Kasai .................... | H04R 19/04 381/174 |
| 2014/0064542 A1* | 3/2014 | Bright .................... | H04R 1/086 381/359 |
| 2014/0374859 A1* | 12/2014 | Kasai ................... | H04R 19/005 257/419 |
| 2018/0152792 A1* | 5/2018 | Hoekstra .............. | H04R 19/005 |

* cited by examiner

*Primary Examiner* — Tuan D Nguyen
(74) *Attorney, Agent, or Firm* — IPro, PLLC; Na Xu

(57) ABSTRACT

The present application discloses a MEMS microphone, including: a substrate having a cavity; and a capacitor system mounted on the substrate. The capacitor includes a back plate connected to the substrate; and a diaphragm forming a capacitor with the back plate. The back plate includes a back plate main body and a first connecting portion extending from the back plate main body toward the substrate, the first connecting portion connects with the substrate, and the diaphragm connects to the back plate main body. The vibration or the stress from the substrate will not transferred to the diaphragm, but released via the first connecting portion.

6 Claims, 2 Drawing Sheets

MEMS MICROPHONE

FIELD OF THE PRESENT DISCLOSURE

The present disclosure relates to microphones, more particularly to a MEMS microphone.

DESCRIPTION OF RELATED ART

With the development of wireless communication technology, there are more and more mobile phone users in the world. The mobile phone users are no longer satisfied by the calling function of mobile phone, but require high quality call results. Especially in current development of mobile multimedia technology, mobile phone call quality is more important. The microphone of mobile phone is a voice pickup device in the mobile phone and its design will have a direct effect on call quality.

The microphone with more popularity and better performance at present is MEMS (Micro-Electro-Mechanical-Systems) microphone. A typical MEMS microphone includes a housing, a circuit board engaging with the housing to form a cavity, a MEMS chip and an ASIC chip received in the cavity.

During the mounting process, the MEMS microphone would be damaged due to thermal stress, incorrect (interference) assembly. The microphone will be distorted, and the transformation will be transferred to the MEMS chip, which will affect the stability of the microphone.

Therefore, it is desired that an improved MEMS microphone can overcome the disadvantages mentioned above.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to exemplary embodiment. To make the technical problems to be solved, technical solutions and beneficial effects of the present disclosure more apparent, the present disclosure is described in further detail together with the figures and the embodiment. It should be understood the specific embodiment described hereby are only to explain the disclosure, not intended to limit the disclosure.

Figure 1:
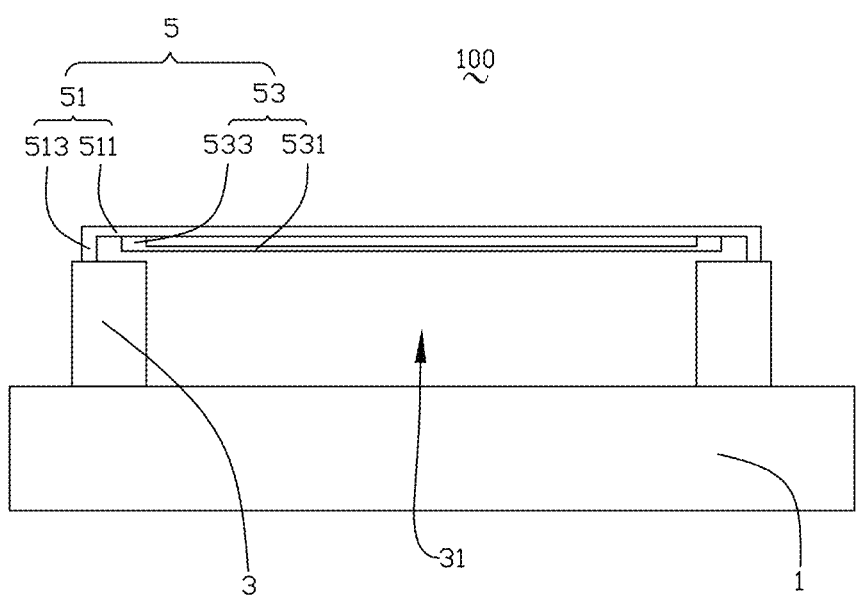
FIG. 1 is a cross-sectional view of a MEMS microphone in accordance with an exemplary embodiment of the present invention.

Referring to FIG. 1, a MEMS microphone 100, in accordance with an exemplary embodiment of the present invention, includes a circuit board 1, a substrate 3 mounted on the circuit board 1, and a capacitor system 5 mounted on the substrate 3.

The circuit board 1 is a printed circuit board, for outputting electrical signals and carrying internal components in the MEMS microphone 1.

The substrate 3 is used for suspending the capacitor system 5, and forms a cavity 31 cooperatively with the capacitor system 5. The cavity 31 provides an accommodation space.

The capacitor system 5 includes a back plate 51 connected to the substrate 3 and a diaphragm 53 connected to the back plate 51 for forming a capacitor.

The back plate 51 includes a back plate main body 511 and a first connecting portion 51 extending from an edge of the back plate main body 511 toward the substrate 3, and the first connecting portion 51 connects to the substrate 3.

The diaphragm 53 includes a diaphragm main body 531 parallel to and spaced from the back plate main body 511, and a second connecting portion 533 extending from an edge of the diaphragm main body 531. The diaphragm main body 531 connects to the back plate main body 511 by the second connecting portion 533. Especially, the diaphragm main body 531 is perpendicular to the second connecting portion 533.

In the embodiment, the diaphragm main body 531 connects to a side of back plate 511 adjacent to the circuit board 1 by the second connecting portion 533. The diaphragm 53 is accommodated in the cavity 31. In fact, the diaphragm 53 can be connected to the side of the back plate 511 away from the cavity 31, which means the diaphragm 53 is out of the cavity 31.

The second connecting portion 533 is made of insulative material for separating the back plate main body 511 from the diaphragm main body 531 to form a capacitor. In the embodiment, the second connecting portion has a length smaller than a length of the first connecting portion 513.

Figure 2:
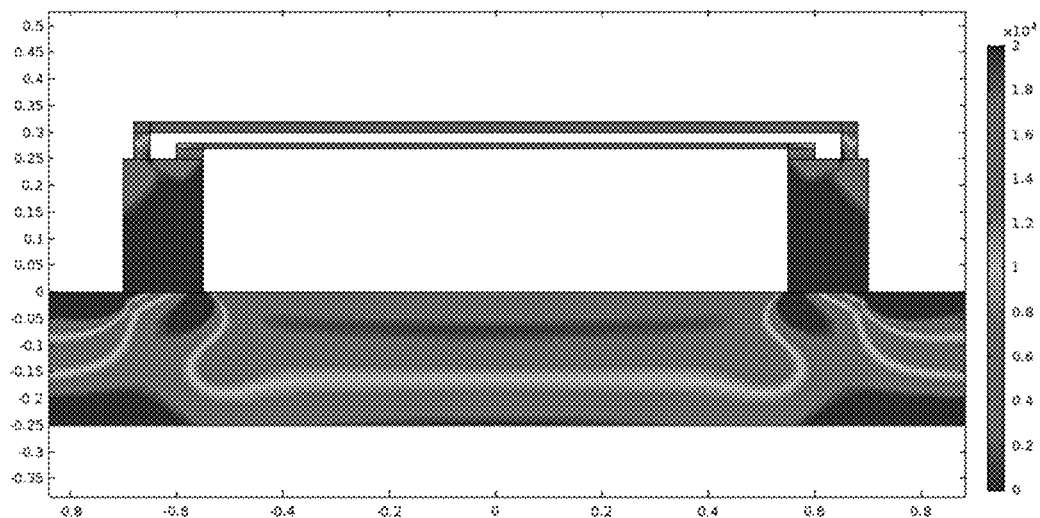
FIG. 2 is a stress inducing diagram of a related MEMS microphone.

Referring to FIG. 2, a stress inducing diagram of a related MEMS microphone is shown. According to the diagram, the diaphragm suffers grater stress, and the compliance of the diaphragm is badly affected, which leads to worse sensitivity.

Figure 3:
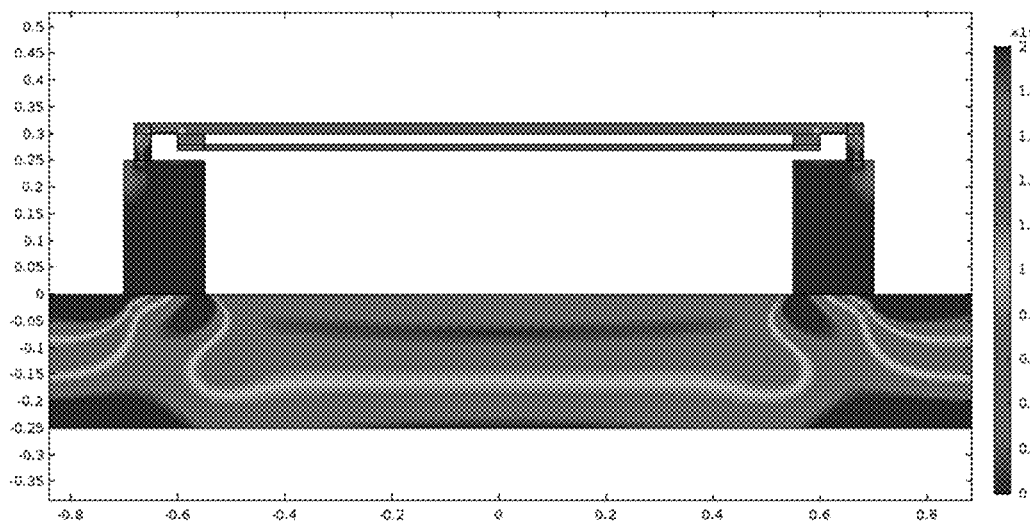
FIG. 3 is a stress inducing diagram of the MEMS microphone of the exemplary embodiment of the present invention.

Referring to FIG. 3, a stress inducing diagram of the MEMS microphone of the present invention is shown. Compared to FIG. 2, it is noted that the diaphragm does not bear stress.

The MEMS microphone provided by the present invention is such configured that the diaphragm main body 531 is connected to the back plate main body 511 by the insulative second connecting portion 533, not connected to the substrate 3 directly. Thus, the vibration or the stress from the substrate will not transferred to the diaphragm, but released via the first connecting portion 513. Accordingly, the compliance of the diaphragm is ensured, and the sensitivity of the microphone is improved.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone, including:
a substrate having a cavity;
a capacitor system mounted on the substrate, and including
a back plate connected to the substrate; and
a diaphragm forming a capacitor with the back plate; wherein the back plate includes a back plate main body and a first connecting portion extending from the back plate main body toward the substrate, the first connecting portion connects with the substrate, and the diaphragm connects to the back plate main body, the diaphragm includes a diaphragm main body spaced from the back plate main body and a second connecting portion extending from an edge of the diaphragm main body, the diaphragm main body connects to the back plate main body by the second connecting portion.

2. The MEMS microphone as described in claim 1, wherein the diaphragm is received in the cavity.

3. The MEMS microphone as described in claim 1, wherein the diaphragm is out of the cavity.

4. The MEMS microphone as described in claim 1, wherein the second connecting portion is made of isolated material.

5. The MEMS microphone as described in claim 4, wherein a length of the first connecting portion is greater than a length of the second connecting portion.

6. The MEMS microphone as described in claim 1, wherein the second connecting portion is perpendicular to the diaphragm main body.

* * * * *